United States Patent
Chung

(10) Patent No.: US 7,196,570 B2
(45) Date of Patent: Mar. 27, 2007

(54) MULTIPLE-TIME PROGRAMMABLE RESISTANCE CIRCUIT

(75) Inventor: Shine Chien Chung, Sanchung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 179 days.

(21) Appl. No.: 10/993,734

(22) Filed: Nov. 19, 2004

(65) Prior Publication Data

US 2005/0259495 A1 Nov. 24, 2005

Related U.S. Application Data

(60) Provisional application No. 60/568,144, filed on May 5, 2004.

(51) Int. Cl.
*H03K 5/08* (2006.01)
(52) U.S. Cl. ............ 327/525; 327/526; 365/96; 323/297; 323/298; 323/352; 323/354
(58) Field of Classification Search .............. None
See application file for complete search history.

(56) References Cited

U.S. PATENT DOCUMENTS

| | | | | | |
|---|---|---|---|---|---|
| 5,913,138 | A | * | 6/1999 | Yamaoka et al. | 438/600 |
| 6,232,823 | B1 | * | 5/2001 | Tsuchida | 327/525 |
| 6,686,791 | B2 | * | 2/2004 | Zheng et al. | 327/525 |
| 7,072,463 | B1 | * | 7/2006 | Byrd et al. | 379/399.01 |

\* cited by examiner

*Primary Examiner*—Tuan T. Lam
*Assistant Examiner*—Hiep Nguyen
(74) *Attorney, Agent, or Firm*—Duane Morris LLP

(57) ABSTRACT

Fuse circuit designs and the use thereof are disclosed. In one example, a fuse circuit providing predictable total resistances for multiple rounds of programming comprises a predetermined number of fuse stages coupled in series. Each stage comprises a first and a second connecting nodes, a fuse connected between the first and second connecting nodes, a first resistor with its first end connected to the first connecting node, and a second resistor with its first end connected to the second connecting node, wherein the first and second resistors connect to a third and a fourth connecting nodes, which are the first and second connecting nodes of a next fuse stage respectively, through their second ends.

18 Claims, 3 Drawing Sheets

| bit 1, cell 1 | ... | bit m, cell 1 | | | Tag Bit 1 |
|---|---|---|---|---|---|
| bit 1, cell n | ... | bit m, cell n | | | Tag Bit m |

Fig. 3

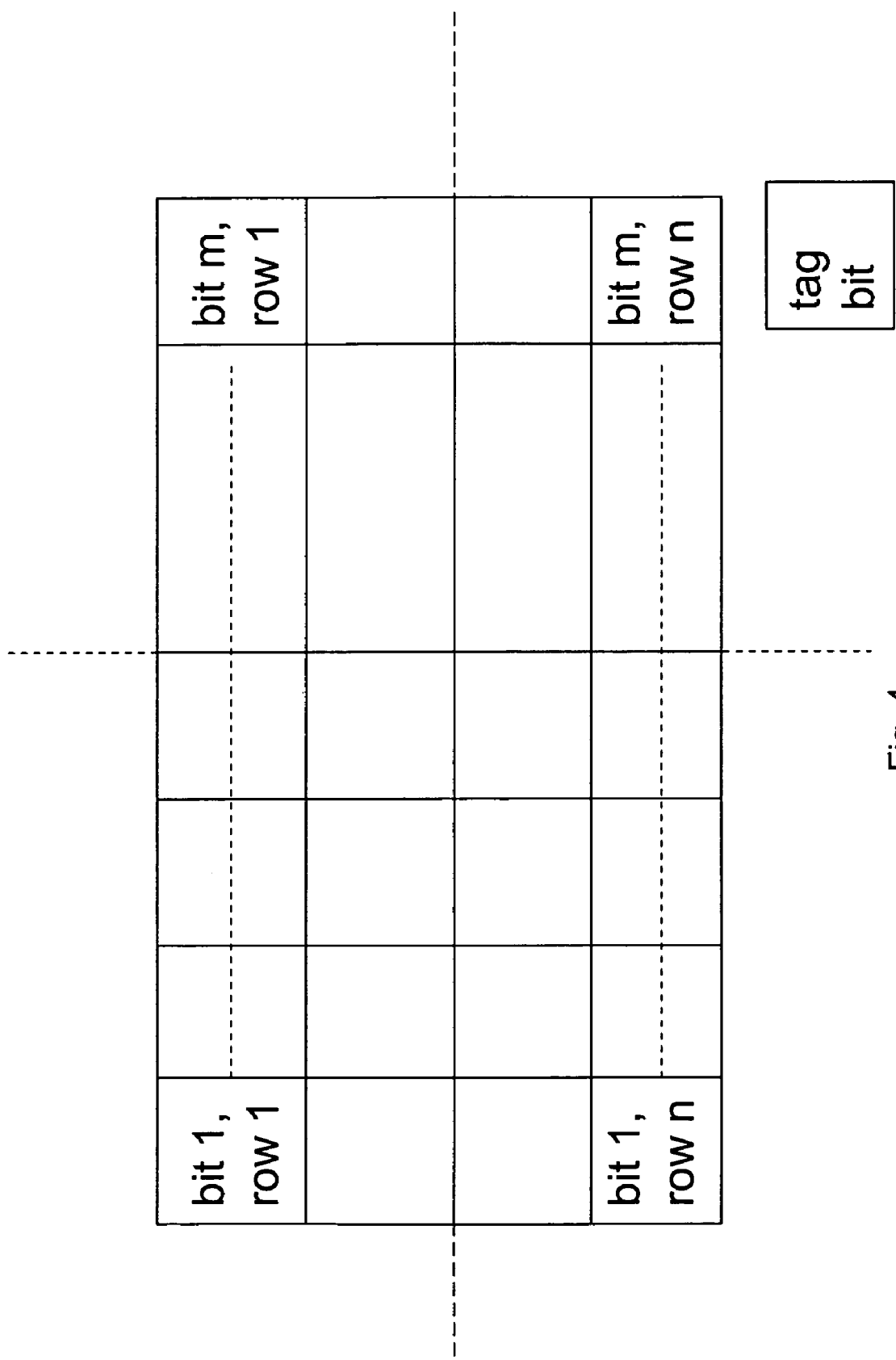

MULTIPLE-TIME PROGRAMMABLE RESISTANCE CIRCUIT

CROSS REFERENCE

The present application claims the benefits of U.S. Provisional Application No. 60/568,144, which was filed on May 5, 2004, and entitled "Multiple-Time Programmable Electrical Fuses."

BACKGROUND

The present disclosure relates generally to semiconductor devices, and more particularly to programmable fuse and fuse circuits.

Fuse elements are widely used in semiconductor memory devices. In a typical application, a plurality of fuse elements are employed in a semiconductor memory device, e.g., a dynamic random access memory (DRAM) device. In general, each of the fuse elements includes a fuse which is selectively opened or severed in order to selectively disconnect the corresponding fuse element from the remainder of the circuit. The process of opening or severing a fuse is sometimes referred to as "blowing a fuse".

There are two basic techniques currently in use for blowing a fuse. Namely, a radiation source such as a laser can be used to irradiate (burn) the fuse until it is opened, or an electrical current which dissipates sufficient heat to open the fuse (i.e., an electrical "overcurrent") can be used. The process of opening a fuse of a fuse element (which typically also includes at least a MOS transistor) is frequently referred to as "programming" the fuse element. Unlike using the laser, the technique of programming a fuse element by using an electrical overcurrent can be performed even after the device has been packaged. For the purpose of this application, the technique of programming a fuse element by using an electrical overcurrent to blow the fuse thereof will be hereinafter referred to as "electrically programming," or simply "programming," the fuse element, and the fuse element which is susceptible to such programming will hereinafter be referred to as an "programmable fuse element," or "electrical fuse," or simply, "fuse." Conventionally the electrical fuse can be programmed once, and once the fuse is programmed, it is irreversible as it is blown open. The electrical fuse that is limited to one time programming is referred to as the one-time programmable (OTP) fuse. Comparing to the OTP fuse, there are multiple-time programmable (MTP) fuses that are much needed in various applications. For example, floating gate based nonvolatile devices can be programmed for multiple times. The floating gate traps charges to differentiate the logic states that it represents. Charges can be injected or removed multiple times.

Desirable in the art of are additional designs that provide a multiple-time programmable resistance circuit using one-time programmable fuses.

SUMMARY

In view of the foregoing, this disclosure provides a multiple-time programmable resistance circuit using one-time programmable fuses.

In one example, a fuse circuit providing predictable total resistances for multiple rounds of programming comprises a predetermined number of fuse stages coupled in series. Each stage comprises a first and a second connecting nodes, a fuse connected between the first and second connecting nodes, a first resistor with its first end connected to the first connecting node, and a second resistor with its first end connected to the second connecting node, wherein the first and second resistors connect to a third and a fourth connecting nodes, which are the first and second connecting nodes of a next fuse stage respectively, through their second ends.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 illustrates a fuse array using the OTP fuses as an MTP fuse according to one embodiment of the present invention.

FIG. 4 illustrates a fuse array using single bit cell fuse array for multiple time programming according to another embodiment of the present invention.

DESCRIPTION

This invention provides a novel resistance circuit using one time programmable (OTP) fuses to allow multiple-time programming while maintaining a deterministic resistant value at certain connecting nodes or points. The e-fuse in the semiconductor devices may be a poly fuse, MOS capacitor anti-fuse, diffusion fuse, or contact anti-fuse, and can be programmed into high resistance state. For example, they can be used in an integrated circuit for chip ID, or serial number. Most fuses can only be programmed once to provide 0 or 1 states corresponding to high or low resistance states or vice versa.

Figure 1:
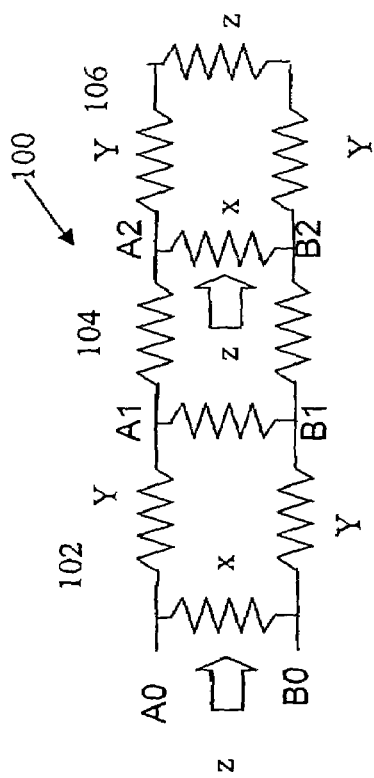
FIG. 1 illustrates a telescoped fuse network in accordance with one embodiment of the present invention.

FIG. 1 illustrates a resistance circuit 100 providing a predictable resistance for programming electrical fuses for multiple times. The resistance network 100 may also be referred to as a telescoped resistance network circuit. When this resistance network 100 is used for multiple rounds of programming, it can be referred to as a fuse circuit with the ability to provide multiple rounds of programming with predictable resistance value for the total resistance in each round. As it is shown, it is desired that this circuit 100 has multiple stages 102, 104, and 106, each of which is used for a programming round. Each stage is deemed to have the same model of connection by having three resistive devices or resistors with X connected between two Ys. It is desired that the total resistance measured at the pair of connecting nodes A0 and B0, A1 and B1, or A2 and B2 stays consistent, e.g., a value Z, if the circuit components on the left side of these pair of connecting nodes do not exist. As shown, there are four connecting nodes for each stage. For example, for the first stage, A0 and B0 are at one side, which may be referred to as the beginning nodes, while A1 and B1 are at the other side, which may be referred to as the ending nodes. Since each stage is connected to another in a serial manner, the ending nodes of a particular stage are the beginning nodes of the next stage. The one-time programmable fuse can be used as the resistor X. The terms "X," "Y," and "Z" also represent their resistance values for the illustration purpose here. Current is directed to burn the fuse X for programming purposes. The relationship among all these elements can be represented as:

$$X\|(2Y+Z)=Z$$

which means X is coupled parallel with two Y and one Z resistors, or mathematically as:

$$(2Y+Z)/(2Y+Z+1)=Z$$

if X is used as a base unit and mathematically be deemed as 1, and Y and Z are deemed to be Y and Z times of the resistance of X. The equation can be further simplified as:

$$(2Y+Z)Z=2Y$$

As long as Y and Z values are adjusted to meet the relationship with respect to X, the fuse circuit 100 can have multiple stages of programming using the fuse X and Y in each stage.

For example, if (2Y+Z), or the total resistance of all the resistors other than the fuse X between any pair of the connecting nodes is set as twice as much as X or 2 units, the above equation can be readily solved as Z=Y=2/3. In other words, in any stage, if the fuse X is of a resistance value of R, the rest of the circuit to the right of the fuse X can be maintained as a total resistance of 2R by having Z and Y being 2R/3, thereby maintaining a constant resistance at any pair of connecting nodes.

When a predetermined voltage is applied between the initial pair of connecting nodes A0 and B0, because of the resistance difference, twice as much of the current will pass through the fuse X than the remaining portion of the telescoped resistance network 100 so that the fuse X between A0 and B0 will be burned. Similarly, the fuse X between A1 and B1 can be blown in the next round or stage of the programming. It is also understood that other proportional relationships between X, Y and Z can be arranged as long as the resistance at each pair of the connecting nodes remain constant. For example, if (2Y+Z), or the total resistance of all the resistors other than the fuse X between any pair of the connecting nodes is set as three times as much as X or 3 units, the above equation can be readily solved as Z=3/4 and Y=9/8. In other words, in any stage, if the fuse X is of a resistance value of R, the rest of the circuit to the right of the fuse X can be maintained as a total resistance of 3R by having Z and Y being 3R/4 and 9R/8, thereby maintaining a constant resistance at any pair of connecting nodes.

Figure 2:
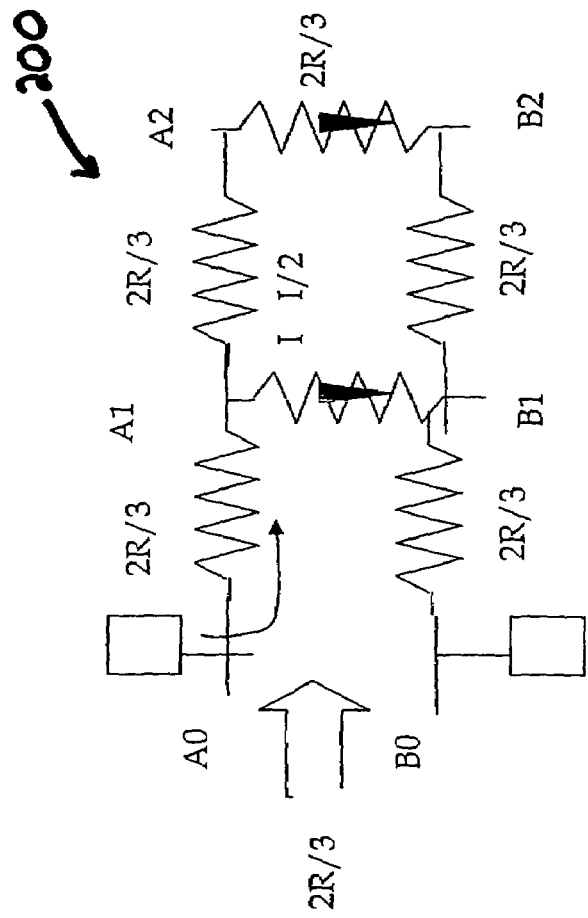
FIG. 2 illustrates programming of fuses in the telescoped fuse network of FIG. 1.

FIG. 2 shows how the current flows to the resistance network after the first fuse X is programmed or burned. When the voltage is applied across the connecting nodes A0 and B0 of an initiating stage for the second time, the current which flows through nodes A0 and B0 is deemed to be zero as it is an open circuit. The current flows through A1 and B1 is assumed to be I, and through A2 and B2 is I/2. As such, only the fuse X between nodes A1 and B1 can be programmed. By repeating this procedure, the fuses are burned down from one end to the other (e.g., left to right) sequentially so that a fuse circuit multi-time programmable (MTP) is formed. A0 and B0 are referred to be the first two connecting nodes of the initiating stage because there is no branch of resistors or fuses coupled to its left side. The calculation of total resistance after each programming round gets more complicated, but the total resistance remains predictable. It is further noted that the fuses between nodes Ai and Bi (i=0, 1, 2, . . . ) can be made of poly fuses. Other resistors in the resistance network circuit 100 can be formed by other types of fuses such as N+, P+ diffusion, or oxide-breakdown fuses, which generally can resist programming.

As a result of the multi-time programming, since the value of Y resistor is known, the total resistance between the initial connecting nodes A0 and B0 is predictable. For example, assuming the fuse X has a value of R, and Y equals 2R/3, and the resistance between any pair of connecting nodes is 2R/3, the resistor network 200 in FIG. 2 exhibits a total initial resistance value of 2R/3 (i.e., R in parallel with 2R). After the first round of programming, it has a total resistance of 2R (i.e., (2R/3)*2+2R/3=2R), and after the second round of programming, it has 10R/3 (i.e., (2R/3)*4+2R/3=10R/3). As illustrated above, the resistances increase by 4R/3 each time. In short, the final resistance after each programming is (2R/3)*(1+2P), where P is the number of programming rounds completed. This type of predictable calculation can go on as long as there is a stage of resistors left. It is understood that the impedance of a blown fuse is assumed to be much higher than the unblown one for the purpose of this invention.

Using a proper sensing circuit, with proper reference resistances set between the resistance values of two consecutive programming rounds, it can be accurately determined whether the fuses are proper programmed. The sensed result is then used to generate a binary number reflecting the logic states of the fuse, which is the resistance circuit.

FIG. 3 illustrates another embodiment of the present invention for using the OTP fuses as an MTP fuse. FIG. 3 shows an array of a plurality of OTP fuses with m number of bits in a cell and a set of tag bits having at least m number of bits so that the array can function as an m-time MTP but using only OTP fuses. Each tag bit is associated with a predetermined bit of each cell, and the predetermined bit of each cell is programmed at a predetermined round of programming based on a programming state of the associated tag bit. For example, assuming the simplest situation where each cell has 2 bits, and the array has a number of these two-bit cells. In addition, the array has one tag bit. When the tag bit is unprogrammed, one of the two bits in the cell is used (e.g., programmed or read), while the tag bit is programmed, the other bit of the two bits in the cell is used.

In another embodiment, for each cell having m bits, there is at least m−1 bits of tag bits implemented for selective programming. Corresponding to the programming of one of the m−1 tag bits, one of the m−1 bits of each cell can be programmed. In one embodiment, the first bit in the n bits will be used, if all tag bits are unprogrammed. The second bit in the n bits will be used, if the first tag bit is programmed while all other tag bits are unprogrammed. Similarly, the third bit in the n bits will be used, if the first and the second tag bits are programmed but not others. This scheme goes on for other bits in n bits. Those m−1 tag bits can be stand alone fuse cells, or part of a physical fuse array. The m−1 tag bits can be placed in the last m−1 bits of a fuse array. They are read out first to determine which bits in the n-bit data will be used.

FIG. 4 illustrates another embodiment of the present invention for using single bit cell fuse array for multiple time programming. In this case, each cell has only one bit, but the array has a plurality of sectors each having a plurality of bits. There is at least one tag bit corresponding to each sector of the array for it to be programmed. For example, when the tag bit is programmed, the top half or the left half sector gets programmed. In fact, multiple tag bits can be used to direct the programming of different sectors of the array. For example, if each row is deemed as a sector for the array having n rows, there can be n bits of the tag bits. When one of the tag bits is programmed, one sector, or one row of the array, is going to be programmed. In short, the array can be divided into different sectors, each sector may have a predetermined number of bits, and there are corresponding number of tag bits that controls the programming of each sector. In addition, the tag bits do not have to be physically different bits, and they can be selected from the bits within the array.

In another embodiment, a first sector will be used, if all tag bits are unprogrammed. The second sector will be used, if the first tag bit is programmed while all other tag bits are unprogrammed. Similarly, the third sector will be used, if the first and the second tag bits are programmed but not others. This scheme goes on for other sectors. Those m−1 tag bits can be stand alone fuse cells, or part of a physical fuse array. The m−1 tag bits can be placed in the last m−1 bits of a fuse array. They are read out first to determine which sector of data will be used.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a particular design, it is nevertheless not intended to be limited to the details shown, since various modifications and structural changes may be made therein without departing from the spirit of the invention and within the scope and range of equivalent of the claims. For example, wherever possible, the term "fuse" should be interpreted to include various kinds of fuses such as N+ poly fuse, P+ poly fuse, constant anti-fuse, metal fuse, PN junction fuse, MOSCAP anti-fuse, reverse biased N+/P+ poly fuse, and intrinsic or nearly intrinsic poly fuse. All the fuse arrays should include either one dimensional fuse arrays or multi-dimensional fuse arrays. Accordingly, it is appropriate that the appended claims be construed broadly and in a manner consistent with the scope of the disclosure, as set forth in the following claims.

What is claimed is:

1. A fuse circuit providing predictable total resistances for multiple rounds of programming, the fuse circuit comprising:
a predetermined number of fuse stages coupled in series, each stage comprising:
first and second connecting nodes;
a fuse connected between the first and second connecting nodes;
a first resistor with its first end connected to the first connecting node;
a second resistor with its first end connected to the second connecting node,
wherein the first and second resistors connect to a third and a fourth connecting nodes, which are the first and second connecting nodes of a next fuse stage respectively, through their second ends,
wherein the first and second resistors are selected so that a constant resistance is measured at the first and second connecting nodes for each stage when the next fuse stage is connected at the third and fourth connecting nodes, and
wherein the first and second resistors of each fuse stage are substantially identical.

2. The circuit of claim 1 wherein the fuse is a one-time programmable fuse.

3. The circuit of claim 1 wherein the fuse is a poly fuse.

4. The circuit of claim 1 wherein a total resistance at a predetermined pair of connecting nodes are predictable.

5. The circuit of claim 1 wherein the fuses of all fuse stages are of a substantially same resistance.

6. The circuit of claim 1 wherein the fuse of a last fuse stage has the substantially same resistance as the constant resistance.

7. The circuit of claim 1 wherein a total resistance measured at the two connecting nodes of an initiating fuse stage increases predictably when the fuse in each fuse stage is programmed.

8. The circuit of claim 7 wherein the fuse in each fuse stage is a one-time programmable poly fuse.

9. The circuit of claim 1 wherein the first and second resistors are N type or P type diffusion fuses.

10. A fuse circuit providing predictable total resistances for multiple rounds of programming, the fuse circuit comprising:
a predetermined number of fuse stages coupled in series, each stage comprising:
first and second connecting nodes;
a one-time programmable fuse connected between the first and second connecting nodes;
a first resistor with its first end connected to the first connecting node;
a second resistor with its first end connected to the second connecting node;
wherein the first and second resistors connect to a third and fourth connecting nodes, which are the first and second connecting nodes of a next fuse stage respectively, through their second ends,
wherein the total resistance measured at the first and second connecting nodes of an initial fuse stage is predictable after each fuse is programmed in each round of programming, and
wherein the first and second resistors of each fuse stage are substantially identical.

11. The circuit of claim 10 wherein the fuse is a poly fuse.

12. The circuit of claim 10 wherein the first and second resistors are N type or P type diffusion fuses.

13. A fuse circuit providing predictable total resistances for multiple rounds of programming, the fuse circuit comprising:
a plurality of fuse stages coupled in series, each stage comprising:
first and second connecting nodes;
a one-time electrically programmable fuse connected between the first and second connecting nodes;
a first resistor with its first end connected to the first connecting node;
a second resistor with its first end connected to the second connecting node;
wherein the first and second resistors connect to a third and fourth connecting nodes, which are the first and second connecting nodes of a next fuse stage respectively, through their second ends,
wherein the first and second resistors are selected so that a constant resistance is measured at the first and second connecting nodes for each stage when the next fuse stage is connected at the third and fourth connecting nodes, and
wherein the fuse of a last fuse stage has substantially same resistance as the constant resistance.

14. The circuit of claim 13, wherein the first and second resistors of each fuse stage are identical.

15. The circuit of claim 13 wherein the fuse is a poly fuse and the first and second resistors are N type or P type diffusion fuses.

16. The circuit of claim 13 wherein a total resistance at a predetermined pair of connecting nodes is predictable.

17. The circuit of claim 13 wherein a total resistance measured at the two connecting nodes of an initiating fuse stage increases predictably when the fuse in each fuse stage is programmed.

18. The circuit of claim 13 wherein the total resistance measured at the first and second connecting nodes of an initial fuse stage is predictable after each fuse is programmed in each round of programming.

* * * * *